(12) United States Patent
Hoke et al.

(10) Patent No.: US 7,184,109 B2
(45) Date of Patent: Feb. 27, 2007

(54) LIQUID CRYSTAL CELL THAT RESISTS DEGRADATION FROM EXPOSURE TO RADIATION

(75) Inventors: Charles D. Hoke, Menlo Park, CA (US); Peter R. Robrish, San Francisco, CA (US); Rene P. Helbing, Palo Alto, CA (US); Ken A. Nishimura, Fremont, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 41 days.

(21) Appl. No.: 10/736,090

(22) Filed: Dec. 15, 2003

(65) Prior Publication Data

US 2005/0128367 A1 Jun. 16, 2005

(51) Int. Cl.
*G02F 1/1333* (2006.01)

(52) U.S. Cl. .............................. 349/54; 349/43; 349/192

(58) Field of Classification Search ............ 349/26–30, 349/43, 54, 192
See application file for complete search history.

(56) References Cited

U.S. PATENT DOCUMENTS

| | | | |
|---|---|---|---|
| 5,688,708 A * | 11/1997 | Kato et al. | 445/25 |
| 6,424,388 B1 * | 7/2002 | Colgan et al. | 349/27 |
| 6,670,753 B1 * | 12/2003 | Hatano | 313/553 |
| 6,804,976 B1 * | 10/2004 | Dain | 62/525 |
| 2004/0021805 A1 * | 2/2004 | Nagata et al. | 349/43 |

\* cited by examiner

*Primary Examiner*—Andrew Schechter
*Assistant Examiner*—Phu Vu

(57) ABSTRACT

Embodiments of the invention involve UV resistant liquid crystal cells. One embodiment of the invention is to increase the volume of the liquid crystal material that is stored inside the cell. For example, trenches may be used to provide reservoirs that hold the additional liquid crystal material. The inventive cell can be used as a SLM in photolithographic imaging systems.

17 Claims, 3 Drawing Sheets

LIQUID CRYSTAL CELL THAT RESISTS DEGRADATION FROM EXPOSURE TO RADIATION

CROSS-REFERENCE TO RELATED APPLICATIONS

This application is related to concurrently filed and commonly assigned U.S. patent application Ser. Nos. 10/736,730 entitled "REAL TIME IMAGE RESIZING FOR DYNAMIC DIGITAL PHOTOLITHOGRAPHY," 10/737,126 entitled "SPATIAL LIGHT MODULATOR AND METHOD FOR PERFORMING DYNAMIC PHOTOLITHOGRAPHY," and 10/736,724 entitled "DEFECT MITIGATION IN SPATIAL LIGHT MODULATOR USED FOR DYNAMIC PHOTOLITHOGRAPHY," the disclosures of which are hereby incorporated herein by reference.

TECHNICAL FIELD

This invention relates in general to liquid crystal cells, and in specific to a liquid crystal cell that is resistant to degradation from radiation.

BACKGROUND OF THE INVENTION

Photolithography is commonly used in the production of microelectronic circuits and boards. Typical photolithography systems use a mask to impose a pattern using ultraviolet (UV) light. The patterned UV light then impinges onto a substrate or board that has been coated with a UV light sensitive photoresist. The photoresist that is exposed to the UV light undergoes a chemical change that either allows it to be removed with a chemical (but does not affect the unexposed photoresist) or protects it from a chemical that removes the unexposed photoresist. In any event, photolithography allows the pattern on the mask to be reproduced onto the substrate. The patterned substrate is then processed to produce a microelectronic circuit.

FIG. 1 depicts a typical photolithography system 10. The system 10 includes a UV light source 11. UV light from the light source 11 is provided to the mask 13 by the optics of the illumination system 12. UV light, with the pattern of the mask 13, is guided to the substrate 15 by the optics of the projection system 14. In some systems, the entire mask is illuminated at the same time. In other systems, only a portion of the mask is illuminated at a time. In these systems, one or more of the illumination system 12, projection system 14, and platform 16 that supports the substrate 15 and/or mask 13, may be moved to illuminate different areas of the mask 13.

There are several problems with this arrangement. One problem is that many masks are needed to produce the simplest of microelectronic circuits. Complex circuits, e.g. processors, may require many more. Thus, each time a different layer is going to be formed, a different mask needs to be used. Thus, the masks must be loaded and unloaded from the lithography machines. Each mask must be carefully handled, stored, and inspected. Any contamination or damage will result in a faulty product. Another problem is that once the masks are created, they cannot be changed. Thus, simple design changes, even a change in scale, will require the creation of a new set of masks.

Prior attempts to solve these problems has been to us a spatial light modulator (SLM) instead of the mask. The image formed by the SLM is dynamic and thus, one SLM can replace all of the masks. The SLM can be readily changed to reflect changes in designs. This additionally removes the problems associated with handling, storing, and inspecting of the masks. One type of SLM is a liquid crystal SLM. However, current art liquid crystal SLM cannot be used in photolithography systems since the ultraviolet light causes the liquid crystal material to decompose, and the SLM to fail.

BRIEF SUMMARY OF THE INVENTION

Embodiments of the invention involve liquid crystal cells that are resistant to electromagnetic or ionizing radiation, for example, light with wavelengths between 100 nm and 400 nm, commonly referred to as UV radiation. However, embodiments of the invention may be used with other wavelengths or ionizing radiation that degrade liquid crystal (LC) material. The inventive liquid crystal cells may be used as spatial light modulators (SLM) that replace photomasks in a photolithographic imaging system. One example of a LC cell is a liquid crystal on silicon (LCOS) cell. These types of cells have been used before in other optical technologies such as microdisplays for projection systems; however, prior attempts to utilize light in the UV wavelength range have failed. The materials that are in these cells are typically organic, and thus break down under exposure to UV light. The degradation of prior cells can appear as an increase in the formation of ionic species, or a deposition of residue on the surfaces of the liquid crystal cell. Both of these effects lead to the eventual electrical or optical failure of the cell. Depending on the intensity of the light source, failure can occur in just a few minutes. In contrast, the inventive cells have lifetimes of thousands of hours, thus enabling an LCOS cell device to be used with UV illumination.

One embodiment of the invention is to increase the volume of the liquid crystal material that is stored inside a liquid crystal cell. An example of this embodiment is to provide trenches around the cell and/or around one or more active elements of the cell. The trenches provide reservoirs that hold the additional liquid crystal material. This embodiment operates because the contaminants generated by UV exposure can diffuse through the liquid crystal material. An enhancement to this embodiment is to place electrodes in the trenches and apply a DC voltage across the electrodes. The electrodes will attract ionic species of the contaminants, and cause these contaminants to migrate away from the active area and into the trenches.

Another embodiment of the invention uses an inorganic layer (e.g. silicon dioxide) as the alignment layer in the cell, instead of using an organic material as the alignment layer. The inorganic layer should be transparent and/or non-absorbing to the wavelengths of light that be incident onto the layer, e.g. UV light. The organic layers rapidly decompose when exposed to UV light. Without an alignment layer, the cell functions poorly. Moreover, the decomposition byproducts or contaminants from the decomposed layer also degrade the operation of the cell. On the other hand, the inorganic alignment layer is essentially transparent to light in the UV spectrum and can induce the necessary alignment to the liquid crystal material.

A further embodiment of the invention uses a pump to circulate liquid crystal material through the cell. A pump or other device is used to move liquid crystal material across the active area. Thus, degraded material is removed from the cell and replaced with new or less degraded material. An enhancement to this embodiment is to include micro-channels in the cell to direct or encourage the flow of liquid crystal material in particular directions and/or paths.

Note that the various embodiments may be used in combinations with the other embodiments. For example, a cell may have the inorganic alignment layer embodiment and either trench embodiment or the flow cell embodiment. Another cell may have trench embodiment with the flow cell embodiment. In this cell, the trenches may act as reservoirs, as well as flow channels to provide path for a slow moving 'river' of liquid crystal material. A further cell may have all three embodiments of the invention. Note that embodiments of the invention enable the liquid crystal cell to resist degradation from radiation, e.g. electromagnetic or ionizing radiation. The wavelength of the radiation may be ultraviolet or another wavelength. Note that embodiments of the invention may be used anywhere liquid crystal cells are used, including SLMs used in photolithography.

DETAILED DESCRIPTION OF THE INVENTION

Figure 1:
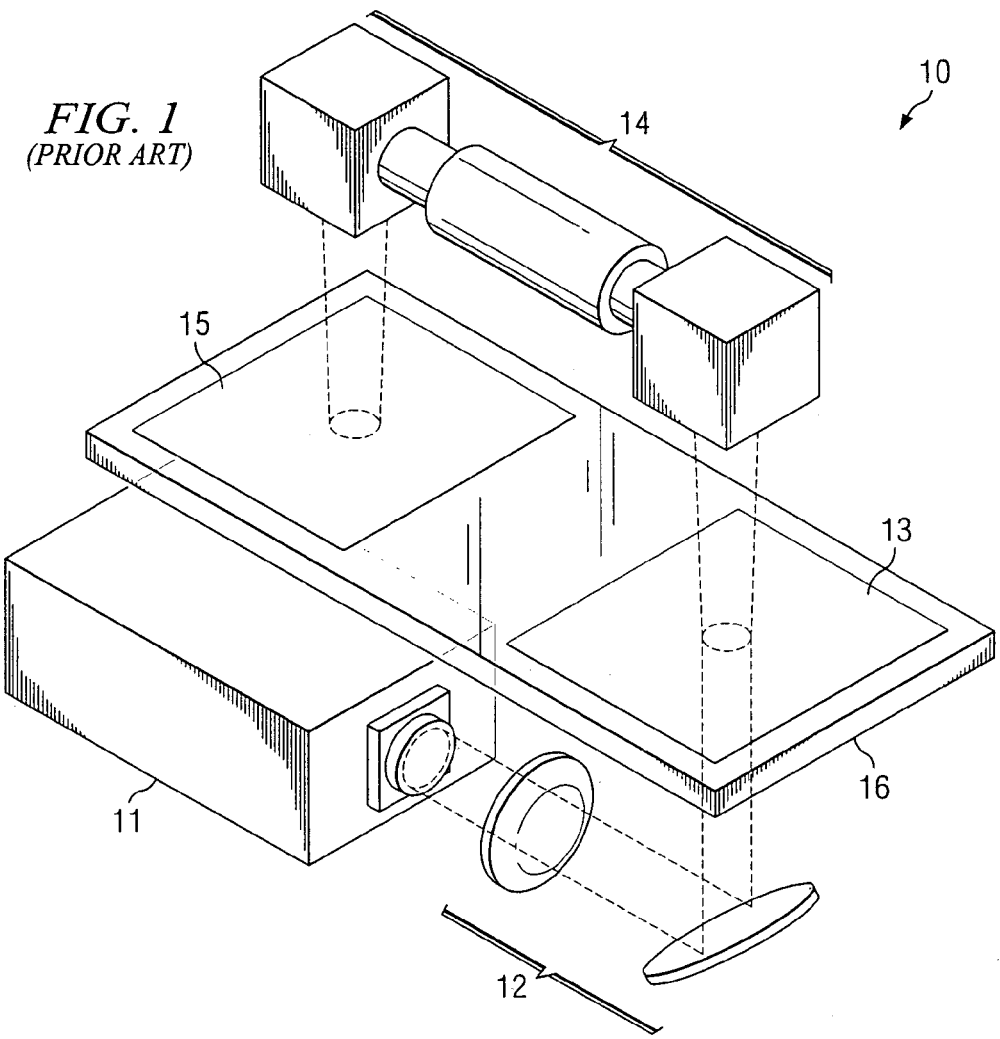
FIG. 1 depicts a typical prior art photolithography system that uses a mask.
Figure 2:
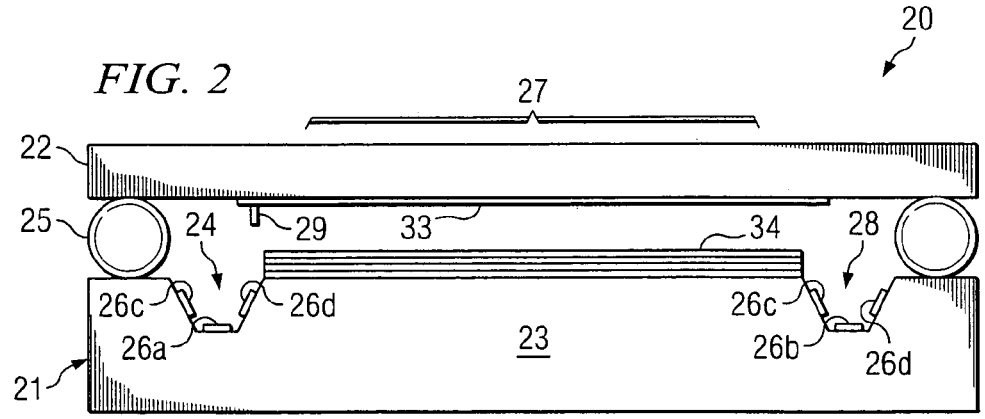
FIG. 2 depicts an example of a liquid crystal cell, according to an embodiment of the invention.

FIG. 2 depicts an example of a liquid crystal (LC) cell 20, according to an embodiment of the invention. The cell has a top plate 22 and substrate 21 with an active area 23. The top plate has an electrode (not shown). The active area 23 has the pixel electrodes that are used together with the top plate electrode to generate an electric field to switch the liquid crystal material. Note that other layers, e.g. alignment layers, polarizer layers, anti-reflection layers, dielectric layers, etc., that are needed for the cell to operate are not shown for the sake of simplicity. Seal 25 maintains the liquid crystal material 28 between the top plate 22 and substrate 21. Light 27, e.g. UV light, from a light source (not shown) impinges onto the active area 23. An example of a liquid crystal cell is disclosed in U.S. Pat. No. 6,329,974, the disclosure of which is hereby incorporated herein by reference.

The cell also has two alignment layers (not shown in FIG. 2), one proximate to the top plate, and the other proximate to the active area. The alignment layers align the liquid crystal material in the absence of an applied field. The liquid crystal material will change its alignment based upon an applied field that is generated by the top plate electrode and the pixel electrodes. Thus, various pixel electrodes may be activated, which in turn affects the alignment of the liquid crystal material that is proximate to the activated pixel electrodes, which in turn affects the optical characteristics of the cell.

Figure 6:
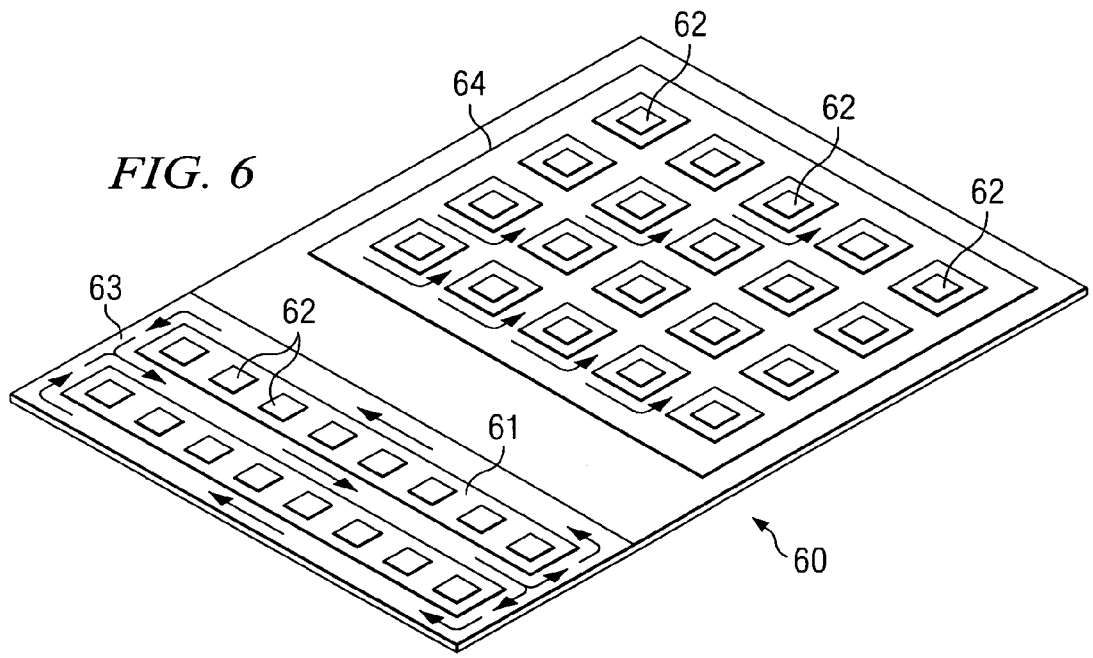
FIG. 6 depicts a still further example of a liquid crystal cell, according to a still further embodiment of the invention.

In this embodiment, additional liquid crystal fluid is stored in the cell in one or more reservoirs. The reservoir(s) reduce the accumulation over the active area of contaminants resulting from the decomposition of the liquid crystal material from exposure to radiation. For example, as shown in FIG. 2, one or more trench(es) 24 are formed into the substrate 21 around the cell as the reservoirs. Additionally, as shown in FIG. 6, trenches 61, 63, 64 may be formed around one or more active elements 62 of the cell, e.g. the pixel electrodes. The trenches 61 may be oriented in one direction, or the trenches 63, 64 may completely surround the active elements. Thus, the trench(es) may completely surround the active area, or may only partially surround the active area. This increases the total volume of liquid crystal material relative to the decomposes amount of liquid crystal material. As liquid crystal material is broken down and contaminants are formed, the contaminants diffuse through the liquid crystal material. With the larger volume, the concentration of the contaminants is reduced.

The trenches may be formed by cutting or etching the substrate. The substrate may also be micromachined by using an anisotropic etchant such as KOH in the case of a silicon substrate. Note that the trench may be located outside of the area being illuminated by the UV light. This protects the liquid crystal material that is located in the trench(es) from being needlessly degraded by the UV light.

Typically, the distance between the top plate 22 and the substrate 21 is a few micrometers. As an example, a trench that is 200 micrometers deep and one millimeter wide would increase the volume of liquid crystal material stored in the cell by about 10-50 times, depending on the area of the LC cell. Thus, if the UV light degrades one microliter per hour, and the cell, through the use of reservoirs, stores 1000 microliters, then the cell may last 1000 hours before needing replacement and/or servicing.

This embodiment may be optionally enhanced by filtering the break down contaminants from the liquid crystal material. One way is to use electrodes with a DC potential applied across them. One or more electrodes 26a, 26b are located in the cell, e.g. in the bottom of one or more of the trenches. The break down of the liquid crystal material may cause the material to decompose into ionic species, i.e., some contaminants have a positive ionic charge and others have a negative ionic charge. These contaminants will be attracted to the charged electrode(s) in the bottom of the channels and migrate away from the illuminated area 27. In the example shown in FIG. 2, electrode 26a and electrode 26b may have a voltage potential applied across them. In another arrangement, two electrodes 26c, 26d may be placed in the trench, with a voltage potential applied across them. The electrodes 26 (note that 26 indicates 26a, 26b, 26c, 26d) may be exposed to the liquid crystal material, or the electrodes may be buried within the silicon substrate 21. The electric field created by the electrodes 26 may be orthogonal to the electric field created by top plate electrode and the pixel electrodes. This will lower the impact of the field from the electrodes 26 on the operation of the LC cell, and provide a net motive force to sweep the ionic contaminants to their respective electrodes 26, and be removed from circulation within the LC device.

Another way to filter the contaminants from the liquid crystal material is to place a filter 29 in the cell that separates the contaminants from the liquid crystal material. An internally driven flow, e.g. electro-kinetic effect, may be used to move the liquid crystal material around the cell. The contaminants maybe separated from the flow. Using electrodes and/or the filter would help to extend the life of the cell by reducing the contaminants in the active area.

Figure 3A:
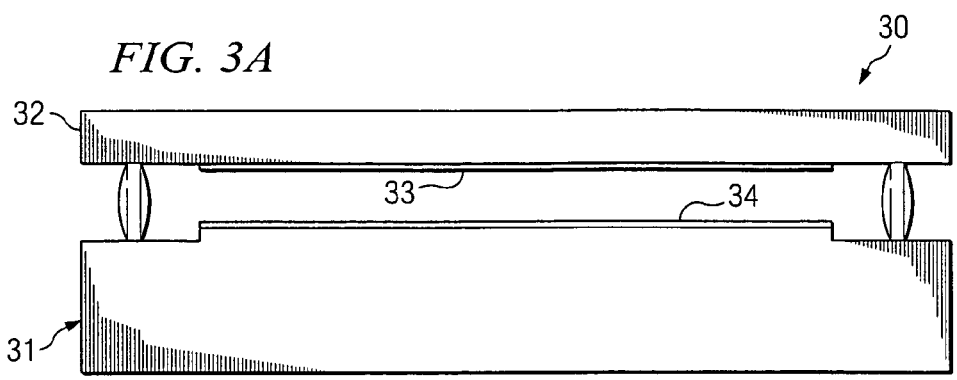
FIGS. 3A and 3B depicts another example of a liquid crystal cell, according to another embodiment of the invention.
Figure 3B:
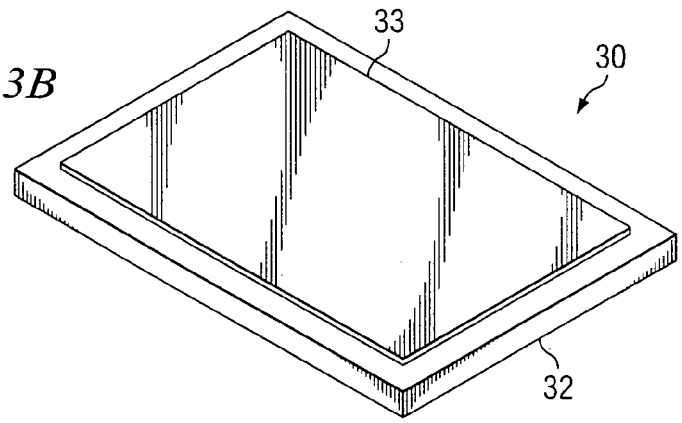

FIG. 3A depicts a side elevation of another example of a liquid crystal cell 30, according to another embodiment of the invention. FIG. 3B depicts an interior perspective view of the cell 30 of FIG. 3A. In this embodiment of the invention, organic materials (other than the liquid crystal material) are replaced with non-organic material. For example, prior art liquid crystal cells use a thin coating of organic material (i.e. polyimide) as an alignment layer. The alignment layer establishes the alignment of the liquid crystal material. These materials absorb some of the UV light, and as a result, gradually decompose to form contaminants that degrade the operation of the cell.

This embodiment of the invention uses a layer of inorganic material, e.g. silicon dioxide ($SiO_2$), as the alignment layer. Silicon dioxide is essentially transparent in the ultra-violet portion of the spectrum, and thus will not quickly degrade or otherwise change from exposure to UV light. The surface features of the layer will induce the required alignment of the liquid crystal material. The silicon dioxide layer may be formed by obliquely depositing evaporated $SiO_2$ on to the top plate 32 (forming alignment layer 33) and/or the active area of the substrate 31 (forming alignment layer 34). The plate and/or substrate is typically oriented at a five degree angle (from a horizontal surface or 85 degrees from a normal axis) during deposition of the evaporated $SiO_2$ to provide the proper orientation 36. The embodiment should be operational for an orientation of between 2 and 10 degrees. The layer may be from 8–12 nanometers (nm) thick, and is typically 10 nm thick. Also note that the silicon dioxide has a refractive index that is similar to that of the top plate, and this will reduce reflective losses of the UV light. Thus, the silicon dioxide layer reduces the accumulation of contaminants resulting from the decomposition of the liquid crystal material from exposure to radiation.

Note that other inorganic materials may be used for the alignment layer, as long as the inorganic material is transparent and/or low absorbing of the operating wavelengths of light or the light of light of interest. Furthermore, instead of a separate layer, the alignment pattern or region may be a portion of another component of the LC cell, e.g. a portion of the top plate and/or a portion of the substrate (e.g. the electrodes). The alignment pattern would be in contact with the liquid crystal material, and would have surface features that would induce the required alignment of the liquid crystal material. The alignment pattern of the component should also be transparent and/or low absorbing of the operating wavelengths of light or the light of light of interest.

Figure 4A:
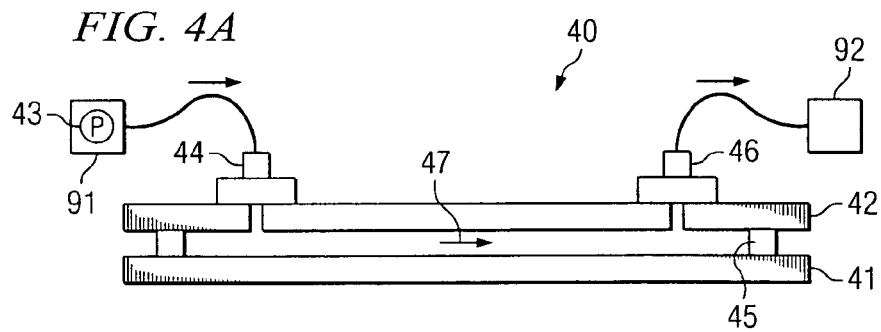
FIGS. 4A and 4B depict further examples of a liquid crystal cell, according to a further embodiment of the invention.
Figure 4B:
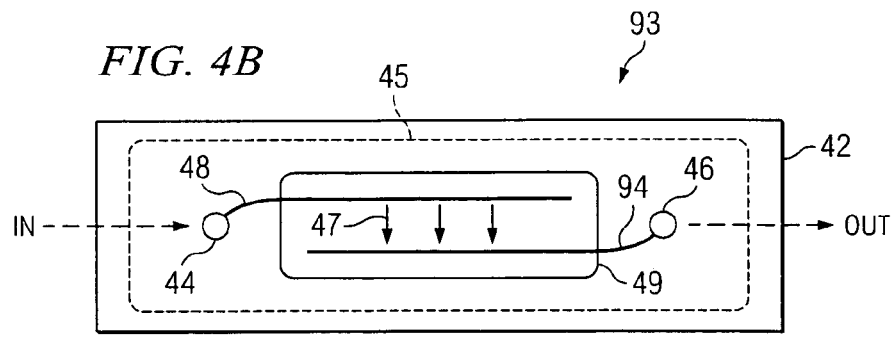

FIG. 4A depicts a side elevation of a further example of a liquid crystal cell 40, according to a further embodiment of the invention. FIG. 4B depicts a top view of different arrangement 93 of the example of FIG. 4A. In this embodiment, liquid crystal material is pumped through the cell. The flow reduces or prevents the accumulation of contaminants in the active area resulting from the decomposition of the liquid crystal material from exposure to radiation. This is important because the contaminants may absorb UV light, and consequently heat up, whereas the liquid crystal material without contaminants minimally absorbs UV light. The build up of heat can damage or destroy the cell. Thus, with this embodiment, the UV degraded liquid crystal material is refreshed, which increases the lifetime of the cell. The liquid crystal material may be refreshed by discarding the material after one pass, mixing the material in a container and then re-circulating the material back into the cell, and/or filtering or otherwise purifying the material before the material is returned to the cell.

FIG. 4A depicts an example of a cell 40 having a flow of the liquid crystal material. The cell 40 has an inlet 44, outlet 46, a pump 43, a liquid crystal source 91, and a liquid crystal destination 92. The pump 43 may be located in the source 91 or the destination 92, or within the cell 40. The pump 43 may be a rotary pump, a syringe pump, or may be electro-kinetic pump. The pump may operate continuously or intermittently, at various (or predetermined) time intervals. In any case, the liquid crystal material flows 47 from the inlet 44 to the outlet 46, through the active area. The cell is bounded by top plate 42, substrate 41, and seal 45.

The liquid crystal source 91 may be a reservoir or tank that holds liquid crystal material for the cell. New liquid crystal material would be added to the source as needed. The liquid crystal destination 92 may be a reservoir or tank that holds used liquid crystal material from the cell. Used liquid crystal material may be disposed of from the destination as needed. Alternatively, the source 91 and the destination 92 may be parts of a reclamation system, which moves used liquid crystal material back into the cell. For example, source 91 and destination 92 may be the ports of a single tank that mixes the used liquid crystal material to disperse the contaminants in the liquid crystal material. After a period of time the material in the tank would be replaced. Alternatively, the material in the tank may be purified and/or filtered to remove the contaminants from the liquid crystal material before being returned to the cell.

The arrangement of FIG. 4A is adequate for low aspect ratio active areas, e.g. square or circular. However, for high aspect ratio active areas, e.g. rectangles, ovals, etc., it is advantageous to have the liquid crystal material move across the active area in the direction of the shorter axis. This means that the liquid crystal material can move at a slower velocity through the active area, and still prevent the accumulation of contaminants. If material is moved along the longer axis, then either the flow velocity would have to be increased (which may result in poor operation of the cell) or contaminants may accumulate.

The arrangement of FIG. 4B, which is a plan view, can be used for high aspect ratio active areas. The cell 93 of FIG. 4B includes micro-fluidic channels 48, 94 which distribute the liquid crystal material in the direction of the longer axis. This allows the liquid crystal material to flow across the active area in the direction of the shorter axis. The channels 48, 94 cause the liquid crystal material received at inlet 44 to be dispensed evenly across the active area, as well as to be evenly collected from across the active area for delivery to the outlet 46. Since the liquid crystal material is traveling across the shorter axis of the active area, the flow velocity may be reduced. A reduced flow velocity reduces the effect of pressure and prevents flow defects from affecting the normal operation of the LC cell. High flow velocity can affect the alignment of the liquid crystal material and result in poor operation of the LC cell. Causing the liquid crystal material to flow in the direction of the shorter axis allows for a lower flow velocity for a given flow rate. The channels 48, 94 may be built into the silicon substrate 41 or may be fixedly attached in the cell. The channels may also be formed in the top plate, especially if reservoirs are located in the substrate.

In addition, the cell can have an inner seal ring 49, which can also act as a spacer. This ring, having a thickness that is typically one to 10 micrometers, provides the correct spacing between the top and bottom plate of the cell. Also, the seal ring prevents the liquid crystal material from flowing from inlet 44 directly into channel 94 without filly traversing the active area. By providing the seal ring, fluid enters the active area through channel 48 and is evenly distributed across the cell. The ring 49 is typically made of an opaque material like metal, which shields the outer seal 45, which is typically epoxy, from scattered UV light. Even though the epoxy outer seal is not directly exposed, long term exposure to scattered UV light could degrade the seal and compromise the mechanical integrity of the liquid crystal cell. Note that the embodiments have been described in terms of UV light, however, the embodiments may be used for other wavelengths of light or ionizing radiation.

Note that the various embodiments may be used in combinations with the other embodiments. For example, a cell may have the inorganic alignment layer 33 of the embodiment of FIGS. 3A and 3B, the trench(es) 24 of the embodiment of FIG. 2. As another example, a cell may have the inorganic alignment layer 33 of the embodiment of FIGS. 3A and 3B, the pump 43 of FIG. 4A and/or the micro-fluidic channels 48,94 of FIG. 4B. Yet another cell may have the trench(es) 24 of the embodiment of FIG. 2 and the pump 43 of FIG. 4A and/or the micro-fluidic channels 48,94 of FIG. 4B. In this cell, the trenches may act as reservoirs, as well as flow channels to provide path for a slow moving 'river' of liquid crystal material. A further cell may have all three embodiments of the invention.

Figure 5:
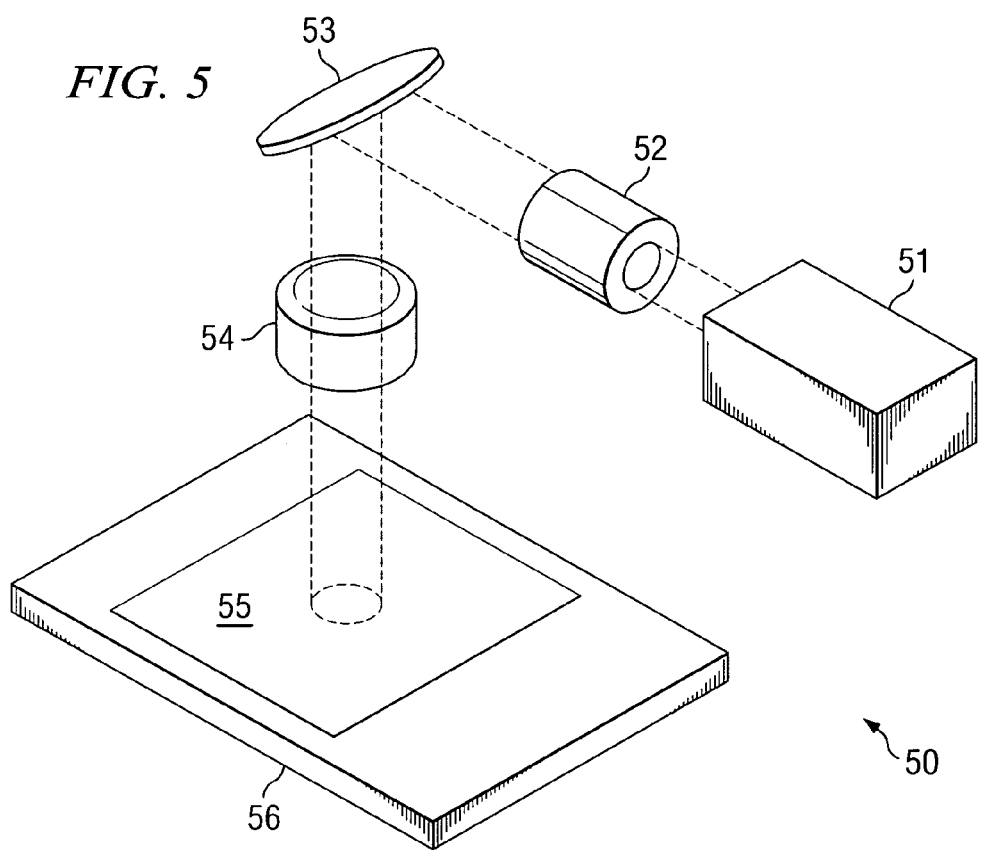
FIG. 5 depicts an example of a liquid crystal cell being used as a SLM in a photolithography system according to embodiments of the invention.

FIG. 5 depicts a typical photolithography system 50 that includes a spatial light modulator (SLM) 53. The SLM includes a liquid crystal cell that has one or more features of any of the embodiments of FIGS. 2, 3A, 3B, 4A, and 4B. The system 50 includes a UV light source 51. UV light from the light source 51 is provided to the SLM 53 by the optics of the illumination system 52. UV light, with the pattern of the SLM 53, is guided to the substrate 55 by the optics of the projection system 54. In most systems, the entire SLM is illuminated at the same time. In these systems, one or more of the projection system 54 and platform 56 that supports the substrate 55 are moved to illuminate different areas of the substrate 55. The pattern on the SLM may or may not be changed for each of the different areas of the substrate. Note that SLM 53 is a reflection SLM, however, embodiments of the invention will operate for a transmission SLM as well.

Note that with the use of the SLM, the pattern may be changed as needed, e.g., for a design change or for processing each different layer of the product being made. Thus, real time image scaling is possible with the inventive SLM. Also note that the pattern of the SLM may be changed for each part, thus allowing each part to have a unique identifier, e.g. a serial number, that is encoded on each part.

Embodiments of the invention may be used in the production of integrated circuit devices, discrete circuit devices, printed circuit boards, flat panel displays, and IC packaging.

What is claimed is:

1. A liquid crystal (LC) cell, comprising:
   a transparent top plate;
   a substrate including an active area, the substrate and the top plate collectively defining a cavity;
   a reservoir in at least one of the substrate and the top plate and connected to the cavity;
   liquid crystal material within the cavity and the reservoir; and
   an electrode located in the reservoir operable to attract ionic contaminants, wherein the electrode is a first electrode and the liquid crystal cell additionally comprises a second electrode, the first and second electrodes connectable to receive a potential difference, and wherein the electrodes are operable to generate a field parallel to the top plate.

2. The liquid crystal cell of claim 1, wherein the reservoir has at least one of a depth and a width at least 50 times the distance between the top plate and the substrate.

3. A liquid crystal (LC) cell, comprising:
   a transparent top plate;
   a substrate including an active area, the substrate and the top plate collectively defining a cavity;
   a reservoir in at least one of the substrate and the top plate and connected to the cavity;
   liquid crystal material within the cavity and the reservoir; and
   an electrode located in the reservoir operable to attract ionic contaminants, wherein the electrode is operable to generate a field parallel to the top plate.

4. The liquid crystal cell of claim 3, wherein a portion of the liquid crystal cell is illuminated, and the reservoir is located in a non-illuminated area of the substrate.

5. The liquid crystal cell of claim 3, wherein the reservoir surrounds the active area.

6. The liquid crystal cell of claim 3, further comprising:
   a filter that separates from the liquid crystal material contaminants formed during operation of the LC cell by decomposition of the liquid crystal material from the liquid crystal material.

7. The liquid crystal cell of claim 3, wherein the liquid crystal cell illuminated with ultraviolet light.

8. The liquid crystal cell of claim 3, wherein the substrate comprises a semiconductor.

9. The liquid crystal cell of claim 3, wherein the liquid crystal cell is a component of a spatial light modulator.

10. A liquid crystal (LC) cell, comprising:
    a transparent top plate;
    a substrate including an active area, the substrate and the top plate collectively defining a cavity;
    a reservoir in the substrate and connected to the cavity, said reservoir comprising a trench;
    liquid crystal material within the cavity and the reservoir; and
    a plurality of electrodes located in said trench operable to attract ionic contaminants and retain said contaminants in said trench.

11. The liquid crystal cell of claim 10 wherein said electrodes are operable to generate a field parallel to the top plate.

12. The liquid crystal cell of claim 1 wherein said electrodes are located on said substrate and operable to attract ionic contaminants away from said top plate.

13. The liquid crystal cell of claim 12 wherein said electrodes are located near a furthest point from said top plate.

14. The liquid crystal cell of claim 2 wherein said electrodes are located on said substrate near a furthest point from said top plate.

15. The liquid crystal cell of claim 3 further comprising a second electrode, said second electrode being located in the reservoir.

16. The liquid crystal cell of claim 15 wherein said electrodes are located on said substrate and operable to attract ionic contaminants away from said top plate.

17. The liquid crystal cell of claim 16 wherein said electrodes are located near a furthest point from said top plate.

* * * * *